United States Patent [19]

Graf et al.

[11] Patent Number: 4,728,621
[45] Date of Patent: Mar. 1, 1988

[54] FABRICATING A FIELD EFFECT TRANSISTOR UTILIZING A DUMMY GATE

[75] Inventors: Volker Graf, Wollerau; Albertus Oosenbrug, Langnau am Albis, both of Fed. Rep. of Germany

[73] Assignee: International Business Machines Corporation, Armonk, N.Y.

[21] Appl. No.: 934,372

[22] Filed: Nov. 24, 1986

[30] Foreign Application Priority Data

Dec. 6, 1985 [EP] European Pat. Off. ........ 85115572.1

[51] Int. Cl.⁴ .................. H01L 21/265; H01L 21/285
[52] U.S. Cl. .......................................... 437/41; 437/44
[58] Field of Search ..................... 29/571, 576 B, 578, 29/591; 148/1.5

[56] References Cited

U.S. PATENT DOCUMENTS

| | | | |
|---|---|---|---|
| 4,472,872 | 9/1984 | Toyoda et al. | 29/571 |
| 4,488,351 | 12/1984 | Momose | 29/578 |
| 4,503,599 | 3/1985 | Ueyanagi et al. | 29/571 |
| 4,505,023 | 3/1985 | Tseng et al. | 29/571 |
| 4,505,024 | 3/1985 | Kawate et al. | 29/571 |
| 4,512,073 | 4/1985 | Hsu | 29/571 |
| 4,519,127 | 5/1985 | Arai | 29/576 B X |
| 4,532,004 | 7/1985 | Akiyama et al. | 148/187 X |
| 4,546,540 | 10/1985 | Ueyanagi et al. | 29/576 B X |
| 4,561,169 | 12/1985 | Miyazaki et al. | 29/591 X |
| 4,569,119 | 2/1986 | Terada et al. | 29/576 B X |
| 4,642,879 | 2/1987 | Kawata et al. | 29/576 B |

Primary Examiner—George T. Ozaki
Attorney, Agent, or Firm—Stephen J. Limanek

[57] ABSTRACT

A process for the fabrication of "low temperature"-gate MESFET structures, i.e., gate metal deposition takes place after annealing of an n+-implant that form source- and drain- contact regions. The process permits self-alignment of all three important MESFET parts, namely, the implanted contact regions, and both, the ohmic, as well as the gate, contact metallizations. In the process, a multi-layer "inverted-T" structure is used as a mask for the n+-implant and for the ohmic and gate metallizations. The upper part of the "inverted-T" is a so-called dummy gate which is replaced by the Schottky gate after ohmic contact metal deposition. The source-gate and drain-gate separations are determined by the shoulders of the lower layer of the "inverted-T", the shoulders being obtained using sidewall techniques.

17 Claims, 23 Drawing Figures

FABRICATING A FIELD EFFECT TRANSISTOR UTILIZING A DUMMY GATE

DESCRIPTION

1. Technical Field

The invention relates to a process of fabricating a fully self-aligned field effect transistor (FET), the transistor being formed on a semiconductor substrate and comprising a current channel and associated source, gate and drain electrodes. The process is particularly suited for technologies using III-V compound semiconductors such as gallium arsenide (GaAs).

2. Background Art

The FET has become an established element not only in microwave technology but also in switching and data processing system applications. For high speed integrated circuits there is a growing need for submicron FET's, i.e., transistors with gate lengths of below one micron. Furthermore, GaAs structures have received increased attention because of the inherent material properties, particularly the high carrier mobility.

A variety of FET structures and processes for their fabrication have already been proposed, among others there are those for metal-semiconductor field effect transistors (MESFET) using GaAs. Basically, there are two types of proposed processes for the fabrication of self-aligned GaAs MESFET's: one type of process uses a refractory gate metal as a mask for the implantation of the ohmic contact regions, the other type of process uses a "dummy" gate as a mask for the contact implant, the dummy gate being replaced by a Schottky gate after ohmic contact metal deposition.

Refractory gate structures and processes have been described by N. Yokoyama et al. in articles "TiW Silicide Gate Self-Alignment Technology for Ultra-High-Speed GaAs MESFET LSI/VLSI's," in IEEE Transactions, ED-29, p. 1541, 1982, and "A GaAs 1K Static RAM Using Tungsten Silicide Gate Self-Aligned Technology," in IEEE JSC, SC-18, p. 520, 1983. The advantage of this type of process is its simplicity. It allows the fabrication of a simple FET structure with a relatively small number of lithographic steps. The prime concern with this process however is the stability of the metal-semiconductor interface on annealing: since the gate deposition takes place prior to the ohmic contact region implant, the Schottky barrier at the gate-channel interface is exposed to high-temperature cycles required to anneal the implanted material and to alloy the ohmic contacts. During these high-temperature processes the metal-semiconductor interface undergoes changes due to interdiffusion, lateral diffusion, stress, shrinkage, etc. This affects the Schottky barrier height and the threshold voltage of the transistor.

Dummy gate structures and processes have been proposed by K. Yamasaki et al. in articles "GaAs LSI-Directed MESFET's with Self-Aligned Implantation for n+- Layer Technology (SAINT)," in IEEE Transactions, ED-29, p. 1772, 1982, and "Self-Align Implantation for n+-Layer Technology (SAINT) for High-Speed GaAs ICs," in Electronics Letters, 18, p. 119, 1982. The use of a dummy gate makes the fabrication process for MESFET's more complicated compared to the refractory-gate process, however, it offers a number of advantages:

the metal-semiconductor interface is not exposed to a high-temperature cycle and, therefore, is not distorted since the actual gate metal deposition is done after the contact region implant anneal process, there is more freedom in the choice of the gate material, the requirements being determined by the final process steps such as chip mounting, packaging, etc., which are significantly less stringent than with the high-temperature implant anneal, the sequence of process steps permits FET channel measurements (between ohmic contacts) and characterization prior to gate metal deposition, i.e., a final adjustment of the channel threshold can be achieved before device completion, e.g., by channel recessing, thereby improving the yield, the gate metal can be used as the first-level wiring.

The SAINT process referred to above is based on the formation of a dummy "T"-gate structure and the use of this T-structure to mask the contact implantation. Embedding of the T-structure in selectively etchable material like $SiO_2$ and subsequent etching and removal leads to the replication of the foot of the T-structure into a dielectric like $Si_3N_4$, thus defining the actual gate area. In the resulting MESFET, the gate area is self-aligned with respect to the implanted contact regions, the inter-distance being determined by the overhang of the T-shaped dummy gate. There are a few concerns regarding this process:

the gate length of the MESFET is defined by the foot of the dummy T-structure that is formed by an isotropic, or partially isotropic, etching process following an anisotropic definition of the cap of the T, the foot dimension being hard to control to the extent required by the device design, in particular for dimensions in the submicron regime, and the gate metallization and the ohmic metallization are not self-aligned with respect to the implanted contact regions. Truly self-aligned metallizations are, however, highly desirable to keep parasitic effects, in particular parasitic series resistances, small. Again, this effect will be of increasing importance when reducing the device dimensions.

DISCLOSURE OF THE INVENTION

It is an object of the present invention to provide a MESFET fabrication process which allows self-alignment of all three critical device parts, namely, the gate and ohmic contact metallizations and the implanted contact regions, with respect to each other.

A further object of this invention is to disclose a process that provides for improved dimensional control of the gate length and gate separation, thereby making the process applicable to the fabrication of submicron structures and permitting a substantial reduction in the required device area.

The invention as claimed is intended to meet the above objectives and to remedy the drawbacks encountered with hitherto known FET fabrication processes. It solves the self-alignment problem by forming a multi-layer mask which includes an "Inverted-T" structure for the contact region implantation. The middle part of the inverted T represents the dummy gate that is replaced by the Schottky gate after self-aligned ohmic contact metal deposition. Depending on the embodiment chosen, the source-gate and drain-gate separation distances can be determined either by sidewall spacers formed at both sides of the dummy gate or by the overhang of an initial "double-T" structure.

The advantages offered by the invention are mainly that, due to the full self-alignment, the source-to-drain spacing given by the gate length and the gate-source and gate-drain separations can be minimized. In fact, the process can be extended to the fabrication of submicron structures whereby high speed devices and high packaging densities can be achieved. The process furthermore allows GaAs surface passivation throughout the whole process thereby providing for better and more reliable process control.

The foregoing and other objects, features and advantages of the invention will be apparent for the following and more particular description of the preferred embodiments of the invention, as illustrated in the accompanying drawings.

BEST MODE FOR CARRYING OUT THE INVENTION

Figure 1:
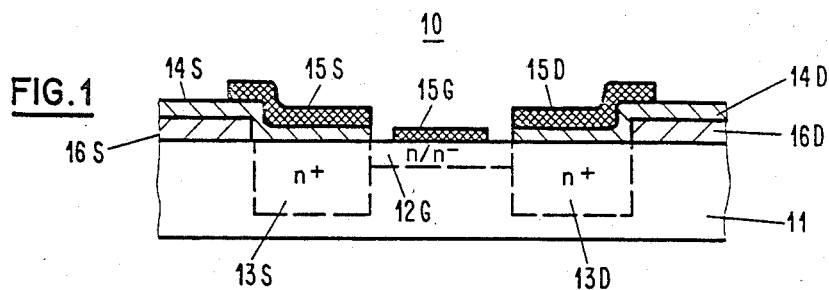
FIG. 1 is a cross-sectional representation of an embodiment of a MESFET produced in accordance with the invention.

Referring now to the drawings in more detail and first to FIG. 1 thereof, there is shown a first embodiment of a MESFET produced in accordance with the present invention. The MESFET 10 is formed on a semi-insulating (SI) GaAs substrate 11. The self-aligned device 10 comprises a relatively shallow channel 12G, its doping concentration resulting in either a n- or n⁻-channel depending on whether enhancement-type (E) or depletion-type (D) devices are required, i.e., it depends on the desired value of the threshold voltage $V_{th}$. Arranged on the channel 12G is a metal gate electrode 15G forming a Schottky barrier at the gate-channel interface. Positioned at both sides of the channel 12G but separated from gate electrode 15G are heavily doped n+GaAs contact regions 13S and 13D forming source and drain regions, respectively. Source and drain electrodes 14S and 14D, respectively, are deposited on their respective n+contact regions forming ohmic contacts therewith, 16S and 16D are passivating layers. Sections 15S and 15D of the gate metallization layer cover the underlying ohmic contact metallization (14S, 14D) lowering the ohmic metal wiring resistance.

Figure 2A:
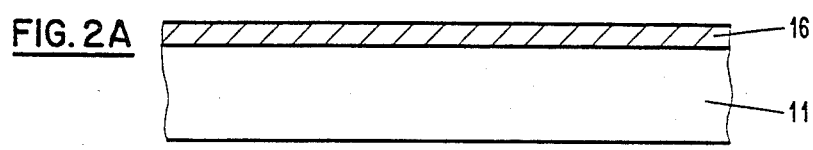
FIGS. 2A–2I, 2K–2N, 2P and 2Q are illustrations of the steps of the process used to fabricate the structure shown in FIG. 1, FIGS. 3A–3C are illustrations of alternative process steps that result in graded contact region implantations.
Figure 2B:
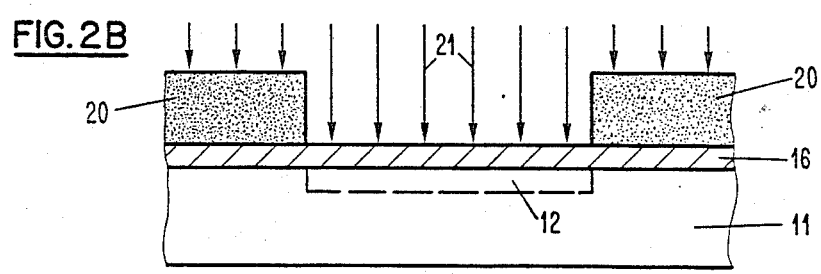
Figure 2C:
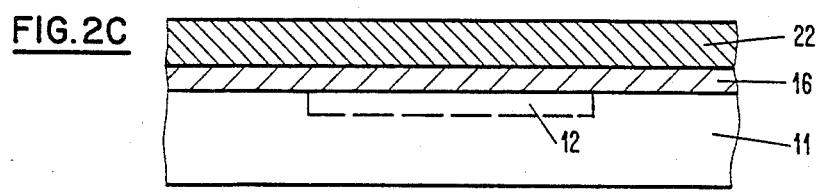
Figure 2D:
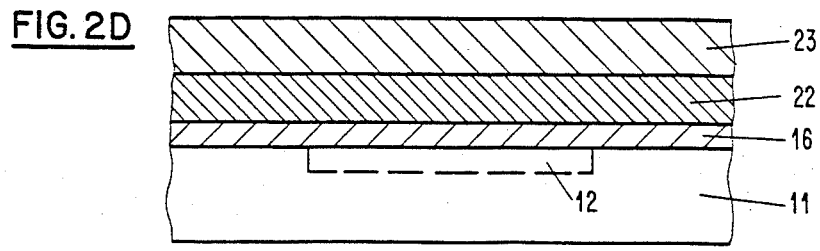
Figure 2E:
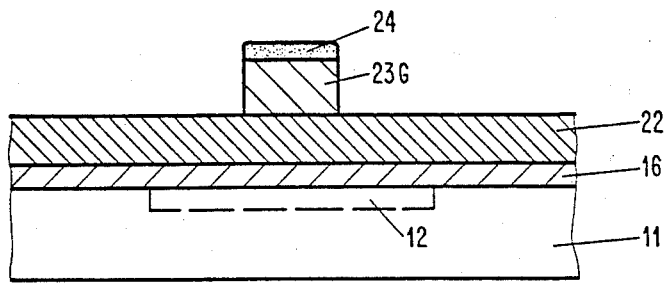
Figure 2F:
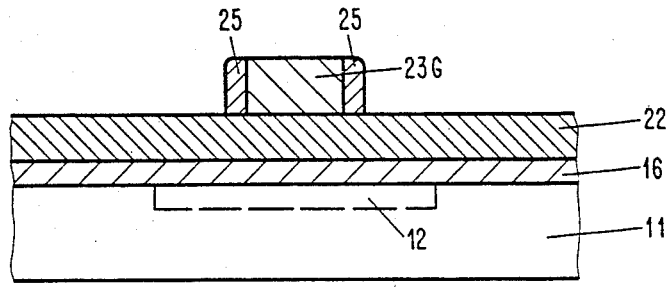
Figure 2G:
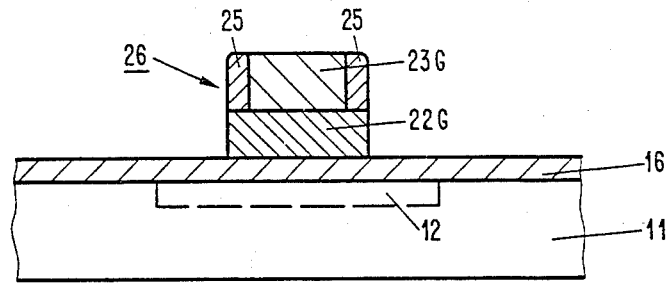
Figure 2H:
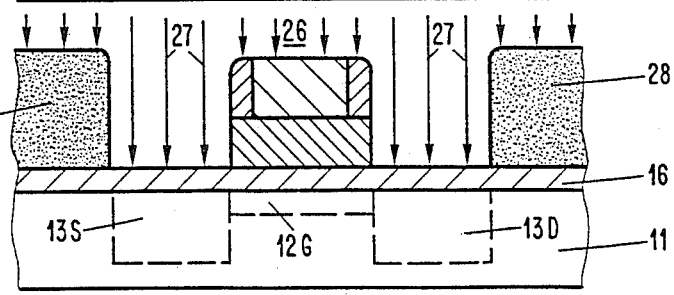
Figure 2I:
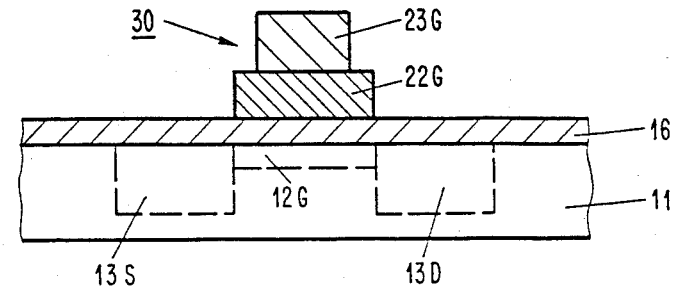
Figure 2K:
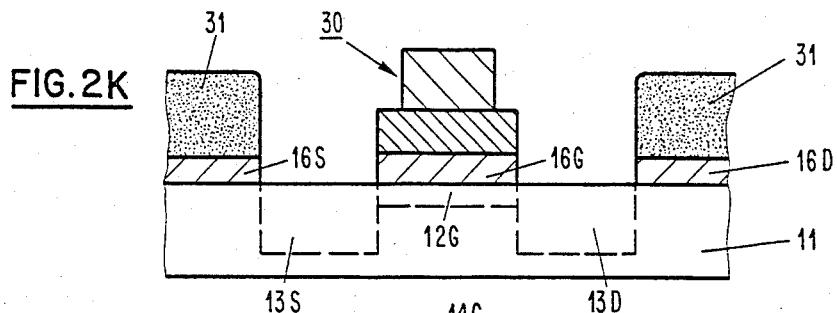
Figure 2L:
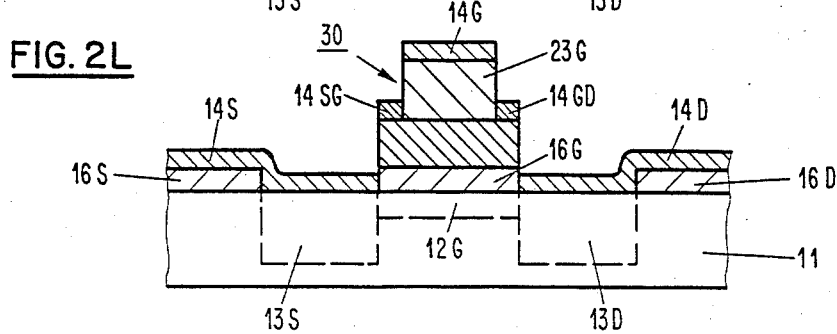
Figure 2M:
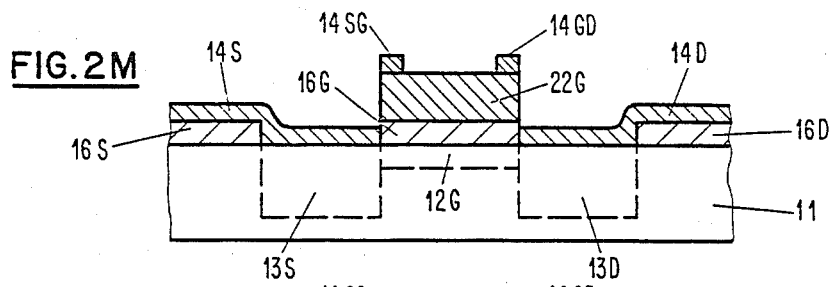
Figure 2N:
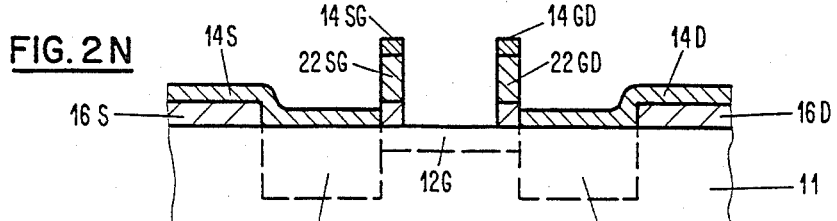
Figure 2P:
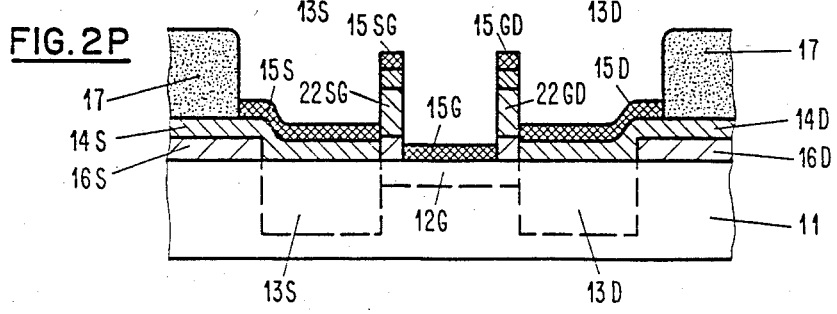
Figure 2Q:
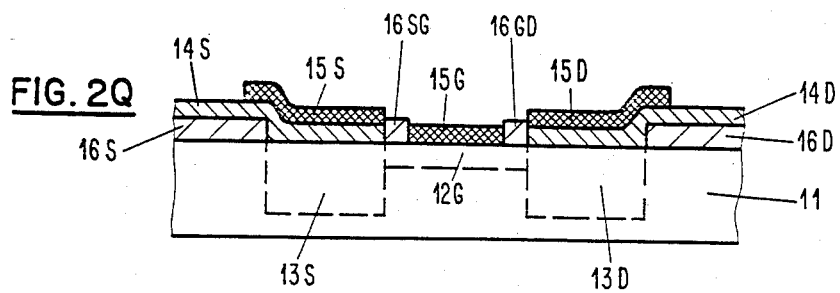

In FIGS. 2A through 2Q the successive steps of the process used to fabricate the MESFET of FIG. 1 in accordance with the present invention are illustrated in detail. These successive steps are listed in Table I indicating the correspondence between the steps and the drawings.

TABLE I

| Step No. | Description of Process Step | FIG. |
| --- | --- | --- |
| 1 | Passivation layer deposition | 2A |
| 2 | Channel implantation (n/n⁻) through the passivation layer | 2B |
| 3 | Deposition of a dielectric layer | 2C |
| 4 | Deposition of dummy gate layer | 2D |
| 5 | Patterning the dummy gate | 2E |
| 6 | Formation of sidewall spacers | 2F |
| 7 | Definition of the mask for the n+-implant | 2G |

TABLE I-continued

| Step No. | Description of Process Step | FIG. |
| --- | --- | --- |
| 8 | n+-implant to form contact regions | 2H |
| 9 | Removal of sidewall spacers and ion implant annealing | 2I |
| 10 | Lithography for the definition of ohmic contacts | 2K |
| 11 | Deposition of ohmic contact metallization | 2L |
| 12 | Removal of the dummy gate | 2M |
| 13 | Opening of self-aligned via hole for gate definition | 2N |
| 14 | Deposition of gate metallization | 2P |
| 15 | Removal of remaining mask portions | 2Q |

While the following description is primarily directed to the fabrication of the MESFET shown in FIG. 1, this description is only exemplary of the inventive method. It should be noted that the thickness and other dimensions, the materials used as well as the process parameters given herein are selected for clarity of illustration and are not to be interpreted in a limiting sense. Most individual process steps that are used to evaporate, to implant, to etch and to pattern are well known and can be performed by employing conventional equipment and techniques. They are, therefore not explained in greater detail.

Referring now to FIG. 2A, the fabrication process is initiated starting from a semi-insulating GaAs wafer representing the substrate 11. In step 1 of the process its surface is covered with a passivation layer 16 which, in the example, consists of sputter-deposited aluminum nitride (A1N) of 80 nm thickness. This layer is a dielectric and permits through-implant ions into the underlying semiconductor substrate 11.

Next, photoresist 20 is applied and patterned as shown in FIG. 2B to define the substrate surface area where the channel 12 is to be formed. Subsequently (step 2), the wafer is subjected to an ion beam (arrows 21). The ions, after passing through passivation layer 16, are implanted in substrate 11 forming n-(or n⁻-) channel 12. In the example, Si (29) is implanted at 90 kV, the dose being in the range of 3 to 6×10¹² cm⁻², depending on whether a D- or E-type device is being fabricated.

After stripping photoresist 20, another dielectric layer 22 is deposited on top of passivation layer 16 as illustrated in FIG. 2C. Silicon nitride (Si₃N₄) is chosen for layer 22 and a layer of 250 nm thickness is deposited using a Plasma Enhanced Chemical Vapor Deposition (PECVD) method (step 3). Thereafter, in step 4, a further dielectric layer 23 is evaporated (FIG. 2D) consisting, in the example, of calcium fluoride (CaF₂), its thickness being 350 nm.

Subsequently, reference is now made to FIG. 2E, a dummy gate 23G is patterned from layer 23 using photoresist lithography (step 5): after applying and patterning a photoresist 24, the exposed portion of the CaF₂ layer 23 is sputter-etched, the Si₃N₄ layer 22 serving as an etch stop.

Upon stripping photoresist 24, sidewall spacers 25 are formed at both edges of dummy gate 23G as shown in FIG. 2F. This is done by first depositing an insulation layer consisting of a polymeric material in a Chemical Vapor Deposition (CVD) or sputter process—the thickness of this layer eventually determining the source-gate and gate-drain distances of the completed MESFET device. The layer of polymeric material is then aniostropically etched in a reactive ion etching (RIE) process until the planar surface portions of the underlying structure are exposed. As a result, portions of the insulation layer remain at the vertical edges of the dummy gate 23G forming sidewall spacers 25 (step 6).

In the next process step 7, a multi-layer mask structure 26 of FIG. 2G is formed which comprises portion 22G of the dielectric $Si_3N_4$ layer, the dummy gate 23G and the sidewall spacers 25. This structure is achieved by using a further RIE process during which the exposed dielectric layer 22 is etched, the AlN passivation layer 16 acting as an etch stop.

As will already be apparent now and will become clearer from the following description, some of the process steps rely on a distinct etch selectivity, i.e., the etch rates of some of the materials used, namely, that of passivation layer 16, dielectric layer 22, dummy gate 23G and that of the sidewalls 25, must be sufficiently different as to permit preferred etching of one of the materials. A broad spectrum of materials is available for this purpose, examples being polysilicon, silicon, silicon oxide, silicon nitride, silicon oxynitride, aluminum nitride, polyimide, etc.

FIG. 2H illustrates step 8, i.e., the n+ion implant (arrows 27) to form the source and drain contact regions 13S and 13D, respectively: after applying and patterning photoresist 28, the Si (27) implant is again made through the AlN layer 16, the implant dose being $5 \times 10^{13}$ cm$^{-2}$ at 130 kV. The channel region 12G is shielded by the multi-layer mask structure 26, the implant being self-aligned to the dummy gate.

Subsequently, photoresist 28 is stripped using acetone, the sidewall spacers 25 are dissolved in a photoresist stripper, and the ion implants annealed in a forming gas ($N_2/H_2$) at 850° C. for 20 minutes (step 9). The annealing takes place with the substrate surface protected by the AlN passivation layer 16 and prior to the deposition of the gate metallization. At this stage, the multi-layer mask structure 26 has been reduced to an "inverted-T" structure 30 as illustrated in FIG. 2I.

In the next step 10, substrate surface areas are defined where the source and drain electrodes forming ohmic contacts with the N+contact regions 13S and 13D are to be deposited. First, photoresist 31 is applied and patterned as shown in FIG. 2K. Thereafter, via holes for the ohmic contacts are etched into passivation layer 16, the patterned photoresist and the inverted-T shaped structure 30 serving as a mask. A wet chemical etch process with hydrogen fluoride (HF) is used for this purpose, to form 16S, 16Y and 16D. The remaining photoresist 31 is then stripped.

In the succeeding step 11 of the process, the ohmic contact metallization, in the example consisting of an AuGeNiAu layer of 80 nm thickness, is evaporated using a photoresist mask not shown in the drawing. This metallization is deposited on the planar surfaces forming the various sections 14S, 14SG, 14G, 14GD and 14D as illustrated in FIG. 2L. Contacts 14S and 14D are self-aligned to the dummy gate. Alloying takes place at 430° C. for 30 seconds.

As shown in FIG. 2M, the $CaF_2$ dummy gate 23G is now removed together with section 14G of the ohmic contact metallization by dissolving the $CaF_2$ in $HCl/H_2O$ (step 12). This is followed by step 13 during which the self-aligned via hole for the gate contact is opened by etching the $Si_3N_4$ layer 22G (RIE using $CF_4$) to form 22 5G and 22GD and, subsequently, the AlN layer 16G (RIE using $CCl_4$). This results in the structure shown in FIG. 2N.

Next, in step 14, the gate metallization, in the example consisting of a palladium-gold (PdAu) layer of 100 nm thickness, is evaporated using a photoresist mask 17. This metallization forms the various sections 15S, 15SG, 15GD and 15D, as illustrated in FIG. 2P. Gate contact 15G is self-aligned to both the ohmic contacts 14S and 14D and to the n+-implant regions 13S and 13D.

In a final step 15, photoresist 17 is stripped and the remaining parts 22SG and 22GD of the $Si_3N_4$ layer are etched off using plasma etching in a $CF_4$ atmosphere. This results in the MESFET structure of FIG. 2Q which corresponds to that of FIG. 1 except for the thin AlN insulations 16SG and 16GD that separate the gate electrode 15G from the source and drain electrodes 14S and 14D, respectively. These may or may not be removed before completing the integrated circuit structure, i.e., before adding further insulations and metallizations.

Figure 3A:
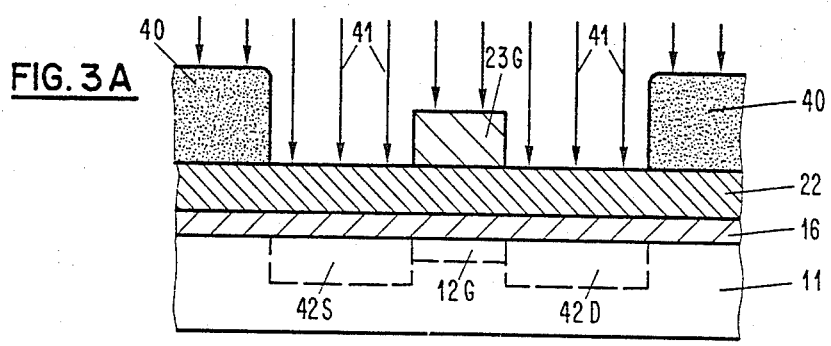
Figure 3B:
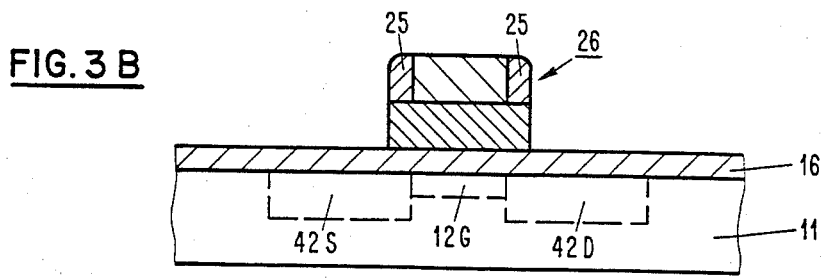
Figure 3C:
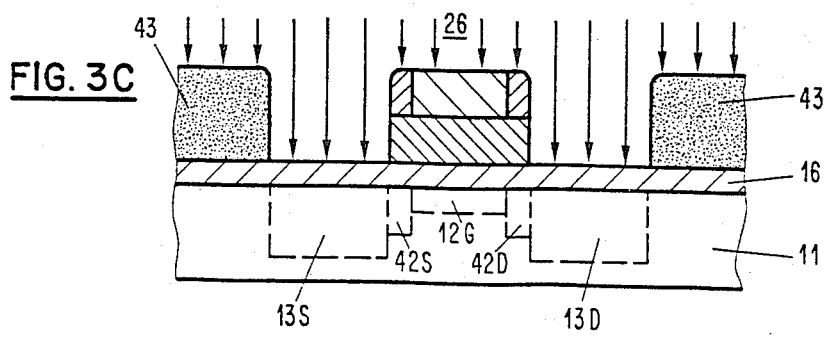

The source resistance (n+-contact region-channel) of the MESFET of FIG. 1 (or FIG. 2Q) can be further decreased by employing a two-step graded contact region implantation. The required process steps are illustrated in FIGS. 3A through 3C. In the complete fabrication process, they replace steps 2F through 2H. The successive steps required are listed in Table II where the correspondence between the steps and the drawings are indicated.

TABLE II

| Step No. | Description of Process Step | FIG. |
|---|---|---|
|  | Same as steps 1 to 5 of Table | 2A-2E |
| 1' | n-implant | 3A |
| 2' | Formation of sidewall spacers | 3B |
| 3' | Definition of the mask for the n+-implant | 3C |
| 4' | n+-implant to form contact regions | 3C |
|  | Same as steps 9 to 15 of Table I | 2I-2N, 2P and 2Q |

The modified fabrication process is initiated starting from the structure shown in FIG. 2E. The next process step (step 1' of Table II) is an intermediate ion implant to form n-implant regions 42S and 42D adjacent channel 12G. This is illustrated in FIG. 3A: after stripping photoresist 24 in FIG. 2E and applying and patterning photoresist 40, the Si (27)-implant (arrows 41) is made through the $Si_3N_4$ layer 22 and through the passivation layer 16 with an implant dose of $1 \times 10^{13}$ cm$^{-2}$ at 200 keV. The channel region 12G is shielded by dummy gate 23G. The implant is self-aligned to the dummy gate.

Subsequently, the multi-layer mask structure 26 of FIG. 3B is formed in virturlly the same way as in steps 6 and 7 of the initial process sequence, i.e., after removal of photoresist 40 sidewall spacers are formed (step 2') and, thereafter, the exposed regions of $Si_3N_4$ layer 22 are etched (step 3').

The n+-implant step 4' masked by a photoresist layer 43 illustrated in FIG. 3C, then corresponds to step 8 of the initial process sequence, i.e., n+-contact regions 13S and 13D are formed. The resulting MESFET structure of FIG. 3C differs from that of FIG. 2Q in that n-zones 42S and 42D are arranged in between the n−-channel 12G and the n+-source and drain contact regions 13S and 13D, respectively.

Figure 4A:
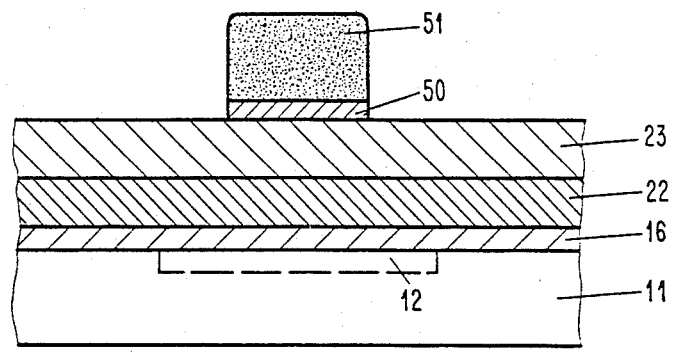
FIGS. 4A–4D are illustrations of process steps resulting in a "double-T" mask structure.
Figure 4B:
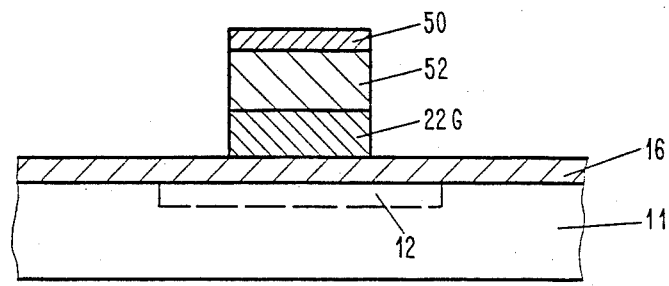
Figure 4C:
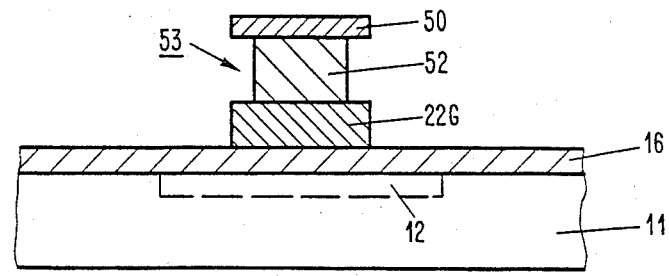
Figure 4D:
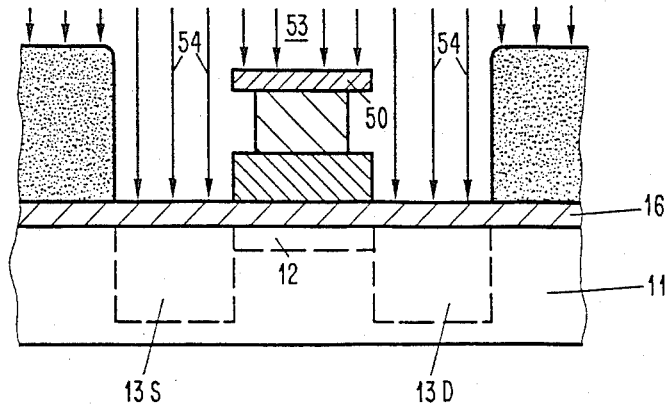

In the processes described above, a multi-layer mask structure 26 has been formed and thereafter gradually reduced through selective etching processes to provide the masks needed in the fabrication of the self-aligned gate and of the source and drain electrodes and n+-contact regions. Mask structure 26 consisted of an inverted-T structure 30 comprising layers 22G and 23G and sidewall spacers 25, the thickness of the latter eventually determining the gate-ohmic contact separations. A different "double-T" multi-layer mask structure 53, shown in FIG. 4D, consisting of an inverted-T structure 22G and 52, as shown in FIG. 4C, topped by an "extending" thin film 50 may be used instead of the mask structure designated 26 in, e.g., FIGS. 2G or 3B.

The required process steps for the formation of such a "double-T" structure are illustrated in FIGS. 4A through 4D which, in the complete fabrication process, replace the steps indicated in FIGS. 2E through 2I. The successive steps required are listed in Table III where the correspondences between the steps and the drawings are indicated.

TABLE III

| Step No. | Description of Process Step | FIG. |
|---|---|---|
|  | Same as steps 1 to 4 of Table I | 2A–2D |
| 1" | Formation of the thin film "topping" the inverted-T structure | 4A |
| 2" | Selective removal of the two dielectric layers (22, 23) to define an initial multi-layer mask structure | 4B |
| 3" | Dummy gate (or "double-T") shaping | 4C |
| 4" | n+-implant to form contact regions | 4D |
| 5" | Removal of "topping" thin film to obtain "inverted-T" structure | |
|  | Same as steps 10 to 15 of Table I | 2K–2N, 2P and 2Q |

This modified fabrication process is initiated starting from the structure in FIG. 2D. The next process step (step 1" of Table III) provides the thin film 50 that eventually "tops" the double-T multi-layer mask structure. This step is illustrated in FIG. 4A: Film 50 is deposited on top of the CaF$_2$ layer 23 and then patterned using photoresist lithographic techniques involving photoresist 51 and an etch process.

Next, layers 22 and 23 are selectively removed (step 2") in an RIE process using film 50 as a mask. The resulting multi-layer structure is shwon in FIG. 4B. In the following process step 3", the dummy gate 52 is tailored by underetching whereby the double-T structure 53 (FIG. 4C) is obtained. It serves the same purposes as the mask structure 26 in FIGS. 2G or 3B, the undercut eventually determining the distance between the gate and the ohmic source and drain contacts.

The subsequent ion implant (arrows 54) for forming the n+-contact regions (step 4") corresponds to that described above in connection with FIG. 2H, the difference being that the "topping" film 50 of mask structure 53 (FIG. 4D) determines the contact region boundaries rather than the sidewall spacers 25 of mask structure 26 in FIG. 2H.

In step 5, the film 50 is removed and the ion implant annealed. At this stage, the inverted-T structure 30 illustrated in FIG. 2I is obtained and the fabrication process can proceed with the steps described above with the aid of FIGS. 2K to 2N, 2P and 2Q.

One further deviation from the initially described process sequence which should be mentioned is a process and device in which the passivation layer 16 is omitted. This layer, providing for better process control and reproducibility, may not be needed in less critical applications and does not form an essential feature of the inventive process.

In summary, the new process allows self-aligning both, the n+-contact region implant as well as the ohmic contacts with respect to the gate. This minimizes the source-to-drain spacing which is important for high packaging densities. For submicron gate length structures requiring shallow channels it is also of advantage that the ohmic contact can be moved as near as possible to the gate especially when the channel doping is high. Particularly, the process employing sidewall spacers for determining the n+-implant-to-gate spacing provides for better control of the critical spacing and dimensions than the hitherto known processes.

From the above it will be evident that many other alternatives, modifications and variations still falling within this scope and spirit of the present invention will be apparent to those skilled in the art.

We claim:

1. A process of fabricating a fully self-aligned field effect transistor, said transistor being formed on a semiconductor substrate and comprising a current channel and associated source gate and drain electrodes, characterized in that the process comprises the steps of defining the current channel at a surface of said semiconductor substrate, forming over said current channel of said substrate a patterned multi-layer mask including portions of a first and a second dielectric layer, the portion of said second layer being deposited on and being narrower than the portion of said first layer, the cross-section of said multi-layer mask thus representing the shape of an inverted T, depositing an ohmic contact metallization onto horizontal surfaces of the structure resulting from the preceding steps, removing said portion of said second dielectric layer and the then exposed center section of said portion of said first dielectric layer that is not covered by said ohmic contact metallization, whereby a mask for the gate contact is provided, depositing a gate metallization through said gate contact mask, and removing the remaining portions of said first dielectric layer together with those sections of the ohmic contact metallization and of the gate metallization deposited on the remaining portions of said first dielectric layer.

2. A process as set forth in claim 1 wherein said multi-layer mask is formed by coating the surface of said semiconductor substrate having a defined current channel with said first dielectric layer, depositing said second dielectric layer on said first dielectric layer, patterning said second dielectric layer to form a dummy gate with respect to said current channel, forming sidewall spacers at the edges of said dummy gate, removing those portions of said first dielectric layer not covered by said dummy gate sidewall spacer-structure, thereby providing an intermediate multi-layer structure, and removing said sidewall spacers.

3. A process as set forth in claim 2 which further includes implanting ions into said substrate to form n+-contact regions defined by said intermediate multi-layer structure adjacent to both ends of said current channel at the surface of said substrate.

4. A process as set forth in claim 2 which further includes implanting ions into said substrate to form first contact regions defined by said dummy gate adjacent to both ends of said current channel at the surface of said substrate, and implanting ions into said substrate to form second contact regions defined by said intermediate multi-layer structure overlapping said first contact regions, thereby providing a graded contact implant.

5. A process as set forth in claim 1 wherein said multi-layer mask is formed by
   coating the surface of said semiconductor substrate having a defined current channel with said first dielectric layer,
   depositing said second dielectric layer on said first dielectric layer,
   depositing and patterning a thin film on said second dielectric layer,
   directionally etching said first and second dielectric layers using said patterned thin film as an etch mask,
   underetching said second dielectric layer, whereby an intermediate multi-layer structure in the form of a double T is provided with respect to said thin film and said first and second dielectric layers, and
   removing said thin film.

6. A process as set forth in claim 5 which further includes implanting ions into said substrate to form n+-contact regions defined by said intermediate multi-layer structure adjacent to both ends of said current channel at the surface of said substate.

7. A process as set forth in claim 1 which further includes depositing an additional passivation layer on said semiconductor substrate prior to the formation of the current channel at the surface of said substrate.

8. A process as set forth in claim 1 wherein said semiconductor substrate is made of gallium arsenide (GaAs).

9. A process as set forth in claim 1 wherein said gate metallization forms a Schottky barrier at the interface with said current channel at the surface of said substrate.

10. A process of fabricating a fully self-aligned field effect transistor, said transistor being formed on a semiconductor substrate and comprising a current channel and associated source, gate and drain electrodes, characterized in that the process comprises the steps of
    defining the current channel at a surface of said semiconductor substrate,
    coating the surface of said substrate with a first dielectric layer,
    depositing and patterning a second dielectric layer to form a dummy gate,
    forming sidewall spacers at the edges of said dummy gate,
    removing portions of said first dielectric layer not covered by said dummy gate-sidewall spacer-structure,
    implanting ions into said substrate to form a contact region defined by said dummy gate-sidewall spacer structure,
    removing said sidewall spacers,
    depositing an ohmic contact metallization onto horizontal surfaces of the structure resulting from the preceding steps,
    removing said dummy gate and the portion of said first dielectric layer underlying said dummy gate, and
    depositing a gate metallization onto the planar surfaces of the structure resulting from the preceding steps.

11. A process for fabricating a field effect transistor comprising the steps of
    forming a current channel at a surface of a semiconductor substrate,
    depositing over said current channel a first dielectric layer,
    depositing over said first dielectric layer a second dielectric layer,
    defining a segment of said second dielectric layer within the ends of said current channel,
    removing said second dielectric layer except for said segment,
    depositing a third layer of material over said current channel and over the top and side surfaces of said segment,
    reactively ion etching said third layer of material from horizontal surfaces to form a masking structure,
    removing said first dielectric layer except for a segment thereof defined by said masking structure,
    implanting ions into said substrate to form contact regions at the ends of said current channel defined by said masking structure,
    removing the remaining portions of said third layer of material,
    depositing a first layer of conductive material over the horizontal surfaces of said first and second dielectric layer segments and over said contact regions,
    removing said second dielectric layer segment and a portion of said first dielectric layer segment defined by said first dielectric segment to form an opening in said first dielectric layer, and
    depositing a second layer of conductive material through said opening onto said current channel at the surface of said substrate.

12. A process as set forth in claim 11 wherein said substrate is gallium arsenide (GaAs) and said second layer of conductive material forms a Schottky barrier at the interface with said semiconductor substrate.

13. A process as set forth in claim 11 wherein said first dielectric layer is silicon nitride ($Si_3N_4$) and said second dielectric layer is calcium fluoride ($CaF_2$).

14. A process for fabricating a field effect transistor comprising the steps of
    forming a current channel at a surface of a semiconductor substrate,
    depositing over the surface of said semiconductor substrate a first dielectric layer,
    depositing over said first dielectric layer a second dielectric layer,
    forming a masking structure including a segment of said first dielectric layer, a segment of said second dielectric layer and a portion of third layer of material, said structure being disposed within the ends of said current channel and said second dielectric layer segment being disposed within the ends of said first dielectric layer segment,
    implanting ions into said substrate to form contact regions at the ends of said current channel defined by said masking structure,
    removing said portion of said third layer of material,
    depositing a first layer of conductive material over the horizontal surfaces of said first and second dielectric layer segments and over said contact regions, removing said second dielectric layer segment and a portion of said first dielectric layer segment to form an opening in said first dielectric layer, and depositing a second layer of conductive material through said opening onto said current channel at the surface of said substrate.

15. A process as set forth in claim 14 wherein said substrate is gallium arsenide (GaAs) and said second layer of conductive material forms a Schottky barrier at the interface with said semiconductor substrate.

16. A process as set forth in claim 14 wherein said portion of said third layer of material is disposed on the sidewalls of said second dielectric layer segment.

17. A process as set forth in claim 14 wherein said portion of said third layer of material is disposed on the upper surface of said second dielectric layer segment and extends to the edges of said first dielectric layer segment.

* * * * *